(12) United States Patent
Uehira et al.

(10) Patent No.: US 8,691,495 B2
(45) Date of Patent: Apr. 8, 2014

(54) PHOTORESIST PATTERN FORMING METHOD, AND MICROLENS ARRAY FORMING METHOD

(75) Inventors: Kousei Uehira, Tokyo (JP); Satoshi Hirayama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/593,929

(22) Filed: Aug. 24, 2012

(65) Prior Publication Data

US 2013/0059239 A1 Mar. 7, 2013

(30) Foreign Application Priority Data

Sep. 1, 2011 (JP) ................................. 2011-191077

(51) Int. Cl.
*G03F 7/20* (2006.01)

(52) U.S. Cl.
USPC ............ 430/322; 430/328; 430/321; 430/312

(58) Field of Classification Search
USPC .................. 430/311, 322, 394, 328, 312, 321
See application file for complete search history.

(56) References Cited

U.S. PATENT DOCUMENTS

| 5,330,862 | A | * | 7/1994 | Tabuchi et al. ..................... 430/5 |
| 5,480,047 | A | | 1/1996 | Tanigawa et al. |
| 6,809,785 | B2 | | 10/2004 | Fujino |
| 6,975,375 | B2 | | 12/2005 | Fujino |
| 2002/0098448 | A1 | * | 7/2002 | Yoshida et al. ............... 430/311 |

FOREIGN PATENT DOCUMENTS

| JP | 6-348032 A | 12/1994 |
| JP | 2002-162645 A | 6/2002 |
| JP | 2006-167650 A | 6/2006 |

* cited by examiner

*Primary Examiner* — Cynthia Kelly
*Assistant Examiner* — Caleen Sullivan
(74) *Attorney, Agent, or Firm* — Fitzpatrick, Cella, Harper & Scinto

(57) ABSTRACT

A photoresist pattern forming method, comprising a first step of forming on an underlayer a photoresist film which includes a convex portion and a concave portion having a thickness thinner than a thickness of the convex portion, and a second step of processing the photoresist film to form, in a portion which has been the convex portion, an opening having a width narrower than a width of the convex portion, wherein in the second step, the convex portion of the photoresist film is at least partially exposed, and the photoresist film is then developed, and exposure light is condensed by the convex portion in exposing the photoresist film.

13 Claims, 18 Drawing Sheets

F I G. 1
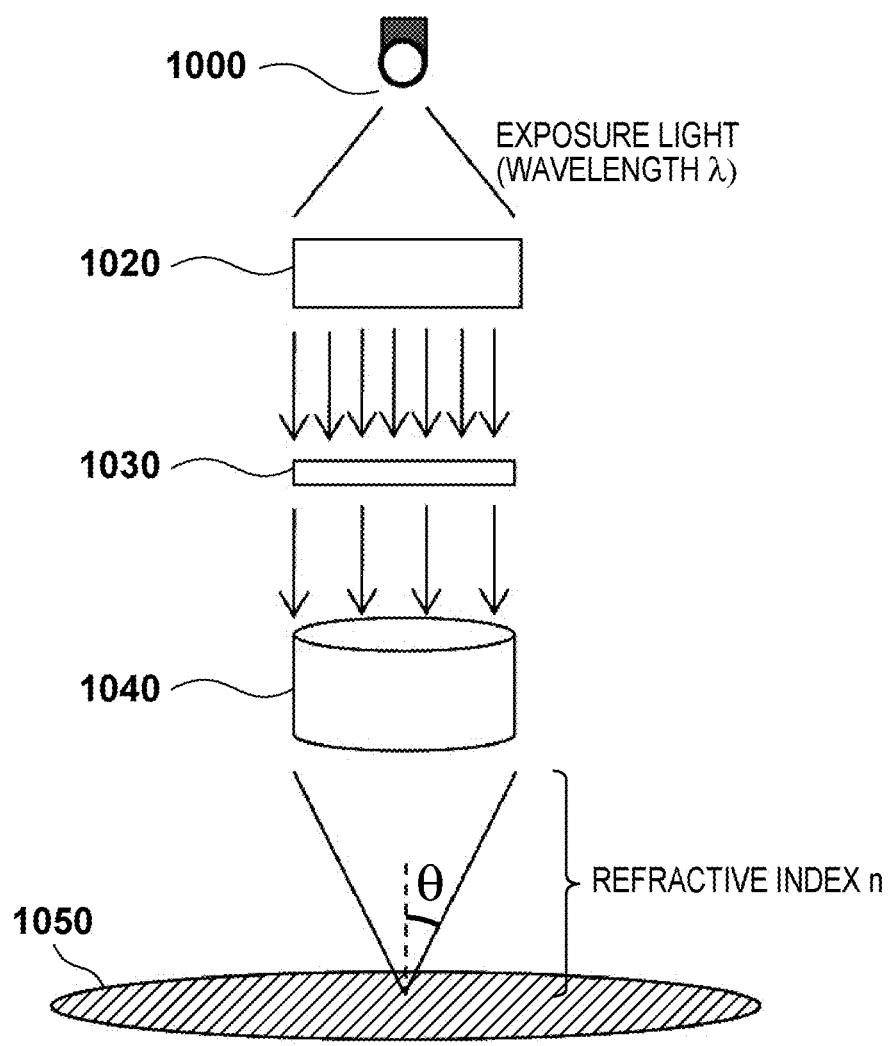

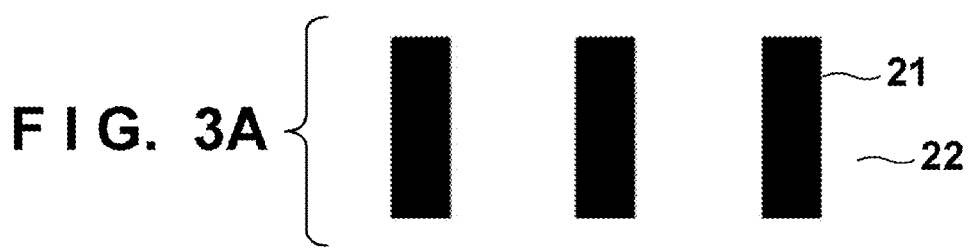
FIG. 3A
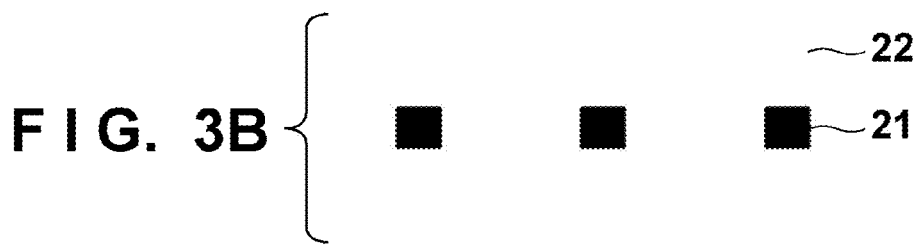
FIG. 3B
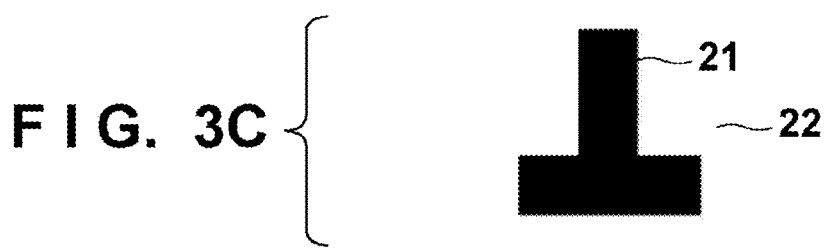
FIG. 3C
FIG. 4
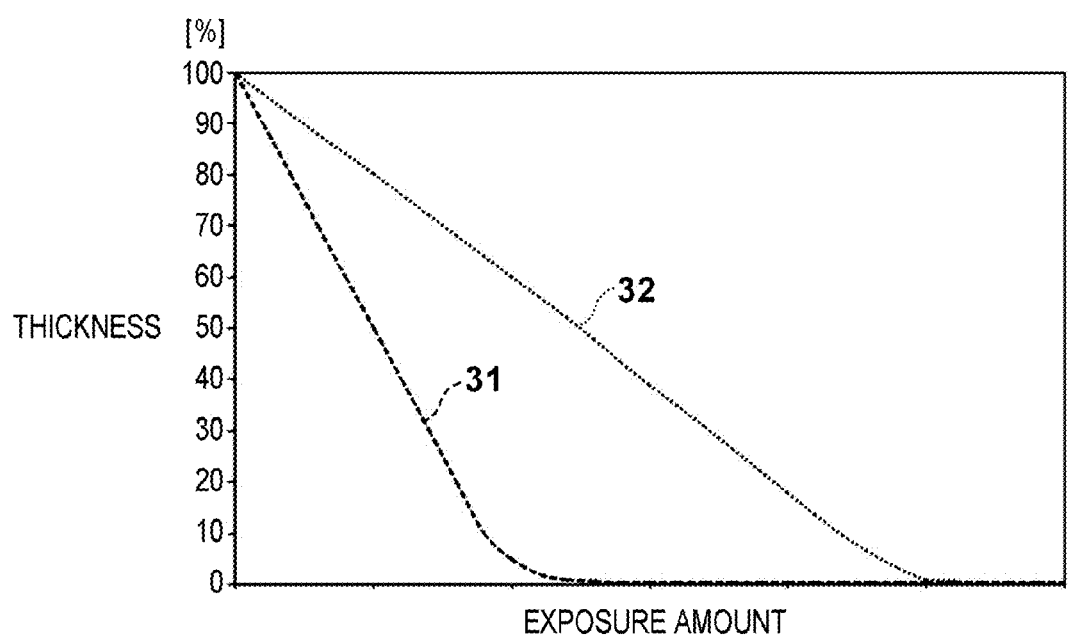

F I G. 9A 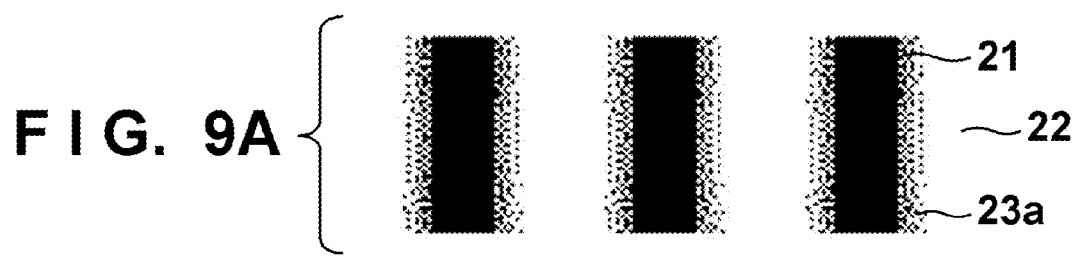
F I G. 9B 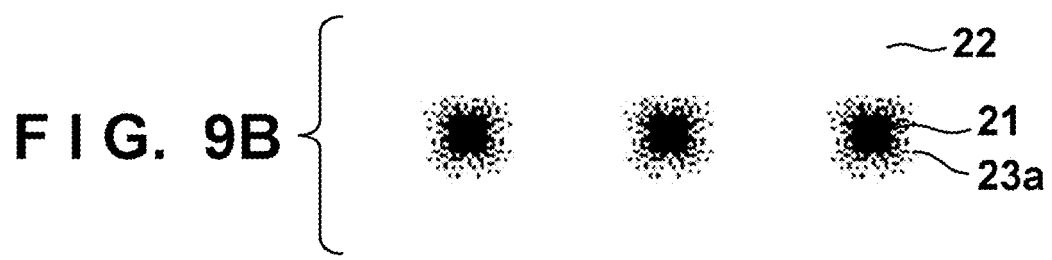
F I G. 9C 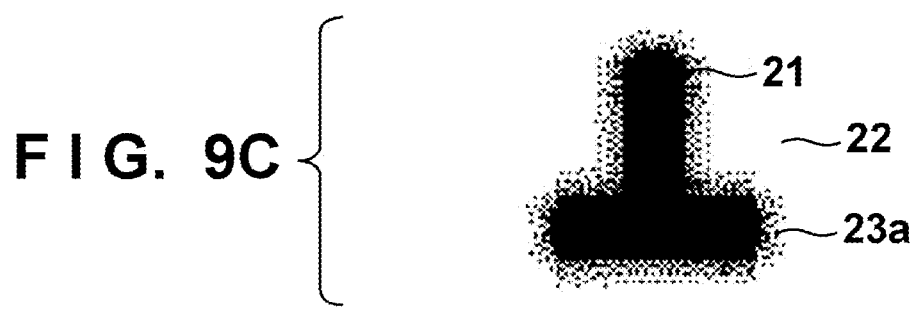

F I G. 16A
F I G. 16B
F I G. 16C
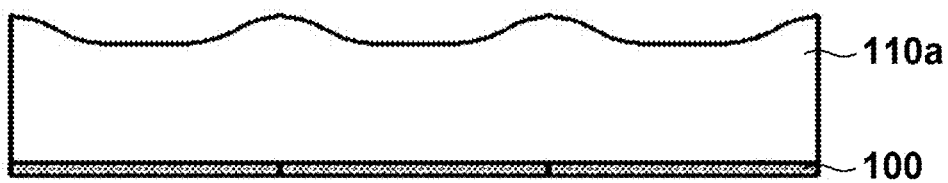
F I G. 16D
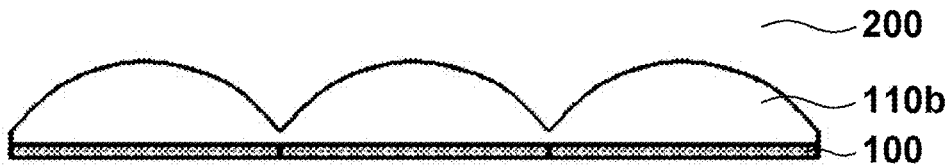

F I G. 18
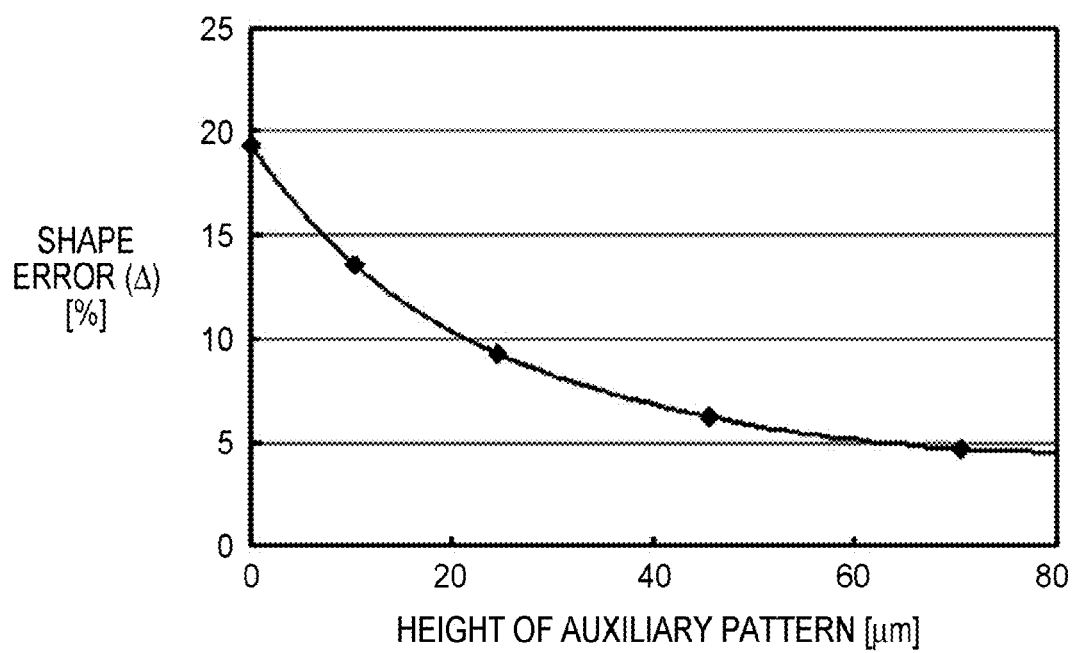

PHOTORESIST PATTERN FORMING METHOD, AND MICROLENS ARRAY FORMING METHOD

BACKGROUND OF THE INVENTION

1. Field of the Invention

The present invention relates to a photoresist pattern forming method and a microlens array forming method.

2. Description of the Related Art

With an increase in packing density of elements in semiconductor integrated circuits, pattern miniaturization is required. Japanese Patent Laid-Open No. 6-348032 discloses a method of forming a phase shift pattern by forming a photoresist film with unevenness. Hence, in an exposure process, light with an opposite phase is generated in convex portions to cancel exposure light with a normal phase in concave portions so as to set zero light intensity, thereby forming a fine resist pattern that exceeds the resolution limit of the conventional lithography techniques.

In the lithography techniques, the resolution has a limit due, for example, to the wavelength of exposure light. In the method described in Japanese Patent Laid-Open No. 6-348032, to cancel light with an opposite phase and light with a normal phase, the unevenness and depth of a phase shift pattern must be adjusted with very high accuracy, requiring a complex technique.

SUMMARY OF THE INVENTION

The present invention provides a technique advantageous in forming a fine pattern in an arbitrary portion using a simpler method.

One of the aspects of the present invention provides a photoresist pattern forming method, comprising a first step of forming on an underlayer a photoresist film which includes a convex portion and a concave portion having a thickness thinner than a thickness of the convex portion, and a second step of processing the photoresist film to form, in a portion which has been the convex portion, an opening having a width narrower than a width of the convex portion, wherein in the second step, the convex portion of the photoresist film is at least partially exposed, and the photoresist film is then developed, and exposure light is condensed by the convex portion in exposing the photoresist film.

Further features of the present invention will become apparent from the following description of exemplary embodiments with reference to the attached drawings.

BRIEF DESCRIPTION OF THE DRAWINGS

FIG. 1 is a view for explaining a reduction projection exposure technique;

FIGS. 3A to 3C are views for explaining a mask used in the first embodiment of the present invention;

FIG. 4 is a graph for explaining the γ characteristics of a photoresist material;

FIGS. 9A to 9C are views for explaining a mask used in the second embodiment of the present invention;

FIGS. 16A to 16D are sectional views for explaining a microlens forming method according to the seventh embodiment of the present invention;

FIG. 18 is a view for explaining the effect of each embodiment of the present invention.

DESCRIPTION OF THE EMBODIMENTS

Figure 2A:
FIGS. 2A to 2E are pattern sectional views for explaining a patterning method according to the first embodiment of the present invention.

A lithography technique will be described first. To achieve pattern miniaturization with an increase in packing density of semiconductor integrated circuits, a lithography technique which employs reduction projection exposure using lenses is mainly used at present. FIG. 1 is a view for explaining the principle of a lithography technique which employs reduction projection exposure. Exposure light emitted by a light source 1000 is focused by a projection lens 1040 having a numerical aperture NA via an illumination optical system 1020 and a photomask (to be simply referred to as a "mask" hereinafter) 1030 having a pattern formed by a light-shielding portion and a light transmissive portion, and strikes a wafer 1050. This transfers a pattern obtained by reducing the pattern of the mask onto the wafer 1050. At this time, a resolution line width R, that is, a minimum feature size that can be transferred onto the wafer 1050 in the lithography technique is given by:

$$R = k1 \times \lambda / NA \tag{1}$$

where k1 is a proportionality constant determined by a transfer process, and λ is the wavelength of exposure light. Also, NA is the numerical aperture of the projection lens 1040, which is given by:

$$NA = n \times \sin\theta \tag{2}$$

where n is the refractive index of the medium between the projection lens 1040 and the wafer 1050, and e is the beam divergence of exposure light.

As the resolution line width R reduces, the resolution improves, so a finer pattern can be formed. Accordingly, to reduce the resolution line width R, it is necessary to reduce the proportionality constant k1, reduce the wavelength λ of exposure light, increase the numerical aperture NA, that is, increase the refractive index n, or increase the beam divergence θ. The present invention relates to a technique of forming a photoresist material applied on the wafer 1050 into a shape having convex portions to allow the convex portions to function as lenses, which refract and condense exposure light so as to reduce the resolution line width R in a pseudo manner.

First Embodiment

A pattern forming method according to the first embodiment of the present invention will be described with reference to FIGS. 2A to 2E and 7A to 7C, separately for first and second steps. For the sake of simplicity, a projection lens is not shown, and a wafer and a mask are shown in proximity to each other hereinafter. In the drawings subsequent to FIG. 7C, a projection lens is not shown, either.

Figure 2B:
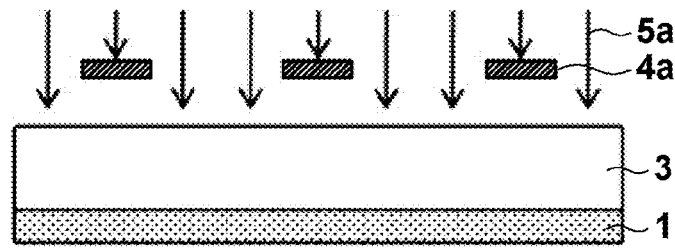
Figure 2C:
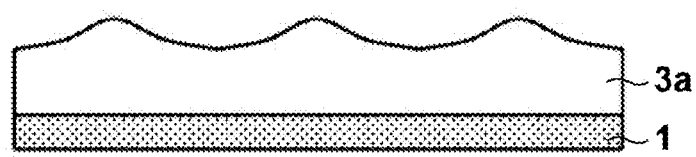

FIGS. 2A, 2B, and 2C are pattern sectional views in substeps of a first step of forming an uneven photoresist film including convex and concave portions on an underlayer. An object on which a desired pattern is to be formed later, such as a silicon substrate, an SiN film, or a metal film, can be selected as an underlayer 1. First, a positive photoresist material 3 is applied onto the underlayer 1 (FIG. 2A), and a first exposure process of irradiating the photoresist material 3 with exposure light 5a is performed using a first mask (FIG. 2B). The first mask includes light-shielding portions 21 and a light transmissive portion 22, as illustrated in FIGS. 3A to 3C. FIG. 3A shows a first pattern which defines lines and spaces. FIG. 3B shows a rectangular, second pattern which can be used in forming holes. FIG. 3C shows a T-shaped, third pattern which can be used in forming, for example, wiring lines. The first mask has at least one pattern of groups formed by the first to third patterns. The shapes of these patterns are not limited, and can be changed as needed. The purpose of use of these patterns is not limited, either, and these patterns can be changed as needed not only to a pattern for forming wiring lines and a pattern for forming element isolation but also to, for example, the color filter pattern of a solid-state image sensing device. Referring to FIG. 2B, the first mask includes light-shielding portions 4a. At this time, the first exposure process need only be performed in an exposure amount in which a photoresist film 3a remains in regions to serve as concave portions in a first development process (to be described later). FIG. 4 shows the exposure amount on the abscissa, and the remaining amount of a photoresist film, that is, the γ characteristics of a photoresist material as a function of the exposure amount on the ordinate. A broken curve 31 indicates the characteristics of a photoresist material having steep γ characteristics, and a dotted curve 32 indicates the characteristics of a photoresist material having slow γ characteristics. Selection of a photoresist material having slow γ characteristics may make it easy to select the exposure amount in which the photoresist film 3a remains in regions to serve as concave portions in a first development process. After the first exposure process, a first development process is performed to remove exposed photoresist portions. In this way, in the first step, an uneven photoresist film 3a having a thickness which is smaller in concave portions than in convex portions is formed (FIG. 2C).

Figure 2D:
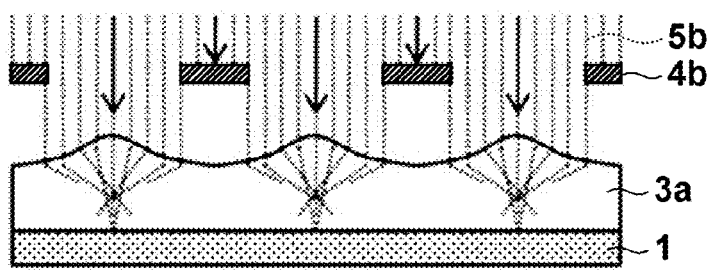
Figure 2E:
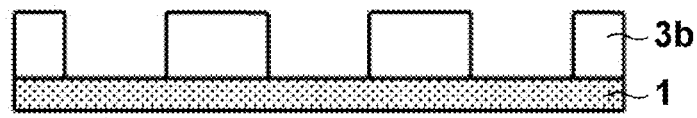
Figure 6A:
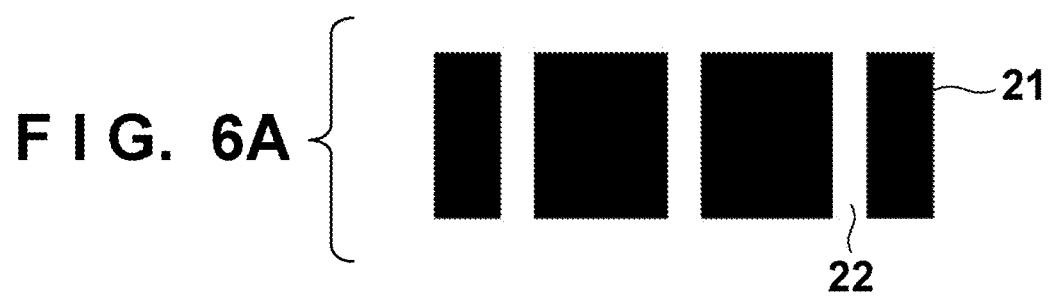
FIGS. 6A to 6C are views for explaining a mask used in the first embodiment of the present invention.
Figure 6B:
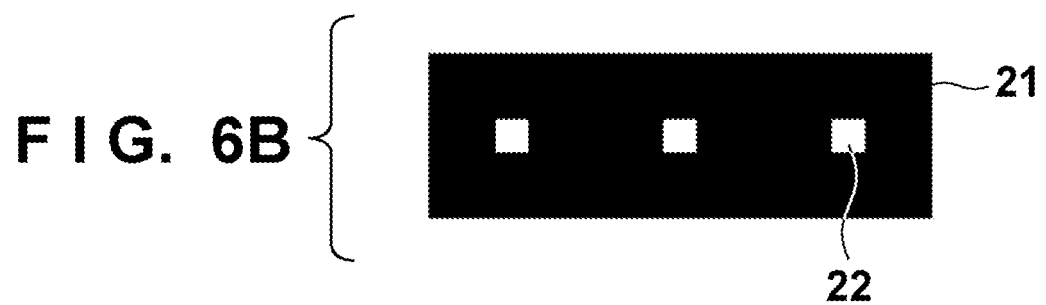
Figure 6C:
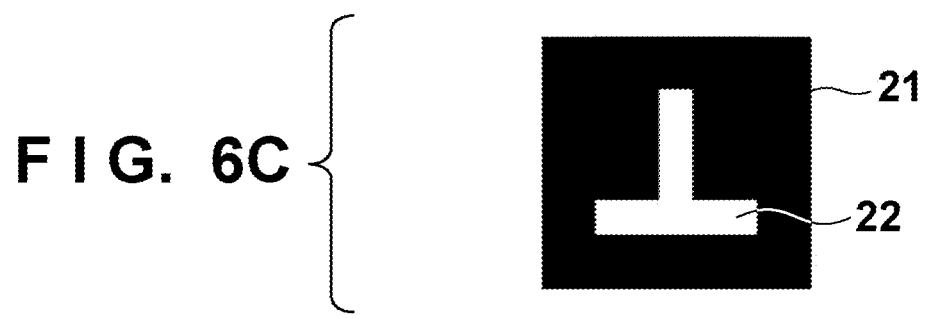

FIGS. 2D and 2E are pattern sectional views in substeps of a second step of processing the uneven photoresist film 3a formed in the first step to form, in portions which have been the convex portions, openings each having a width narrower than that of the convex portion. First, a second exposure process is performed on the uneven photoresist film 3a formed in the first step, using a second mask (FIG. 2D). The second mask has at least one pattern of groups formed by, for example, a line-and-space pattern (FIG. 6A), a hole pattern (FIG. 6B), and a wiring pattern (FIG. 6C), as shown in FIGS. 6A to 6C. Also, the second mask has a pattern with which the convex portions of the photoresist film 3a formed in the first exposure process can at least partially be exposed. Hence, in the second exposure process, exposure light is refracted and condensed by the convex portions of the photoresist film 3a, so exposed portions in the convex portions of the photoresist film 3a become regions narrower than the convex portions, as shown in FIG. 2D. After the second exposure process, a second development process is performed to remove exposed photoresist portions. In this way, in the second step, the uneven photoresist film 3a formed in the first step is processed to form a photoresist pattern 3b including, in portions which have been the convex portions, openings each having a width narrower than that of the convex portion (FIG. 2E).

With the above-mentioned procedure, super-resolution minute openings can be formed, thus forming a super-resolution fine pattern in an arbitrary portion.

Figure 7A:
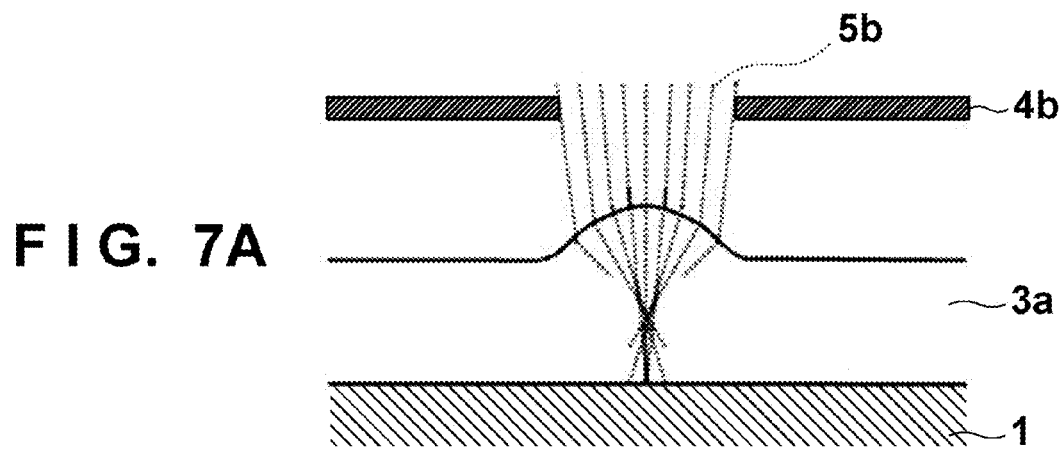
FIGS. 7A to 7C are views for explaining a convex portion in the first embodiment of the present invention.
Figure 7B:
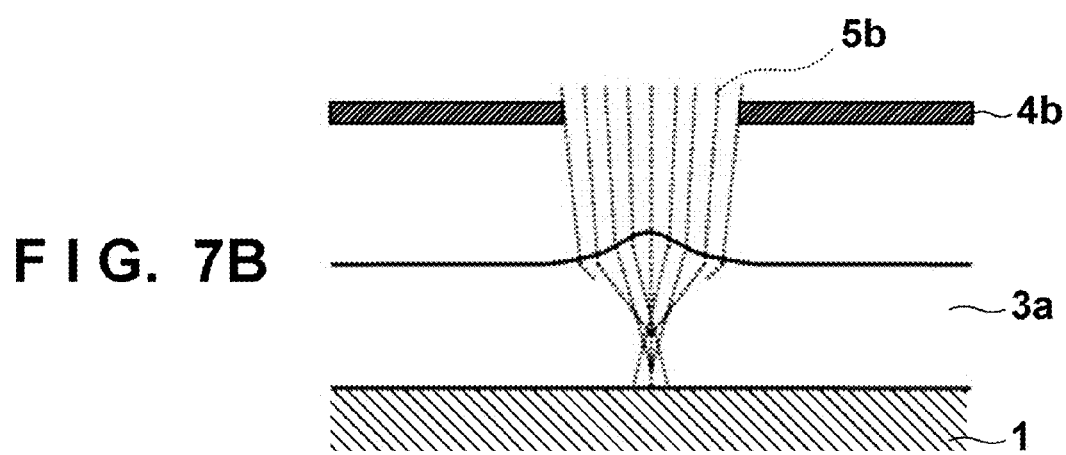
Figure 7C:
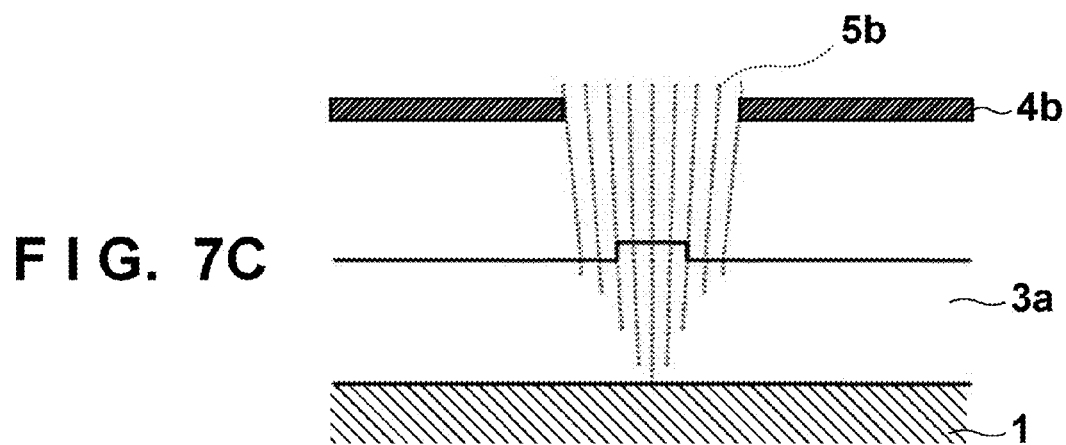

Note that it is only necessary to refract and condense exposure light 5b by the convex portions of the photoresist film 3a in the second exposure process, and then form, in portions which have been the convex portions, openings each having a width narrower than that of the convex portion in the second development process. That is, portions exposed to light in the convex portions of the photoresist film 3a by an exposure process need only become regions narrower than the convex portions. Therefore, the convex portion in the first embodiment may have a lens shape as shown in FIG. 7A, a smooth hill shape as shown in FIG. 7B, or a polygonal shape. Convex portions in other embodiments (to be described later) are the same as in the first embodiment. However, a convex portion having a rectangular shape as shown in FIG. 7C is inappropriate because it can hardly condense exposure light. Hence, to avoid such a rectangular shape, the width of the light-shielding portion 4a which shields the exposure light 5a need only be selected so that the light-shielding portion 4a has a size smaller than a resolution limit, for example, twice or less the wavelength of the exposure light 5a.

Figure 8A:
FIGS. 8A to 8E are views for explaining a collateral process in the first embodiment of the present invention.
Figure 8B:
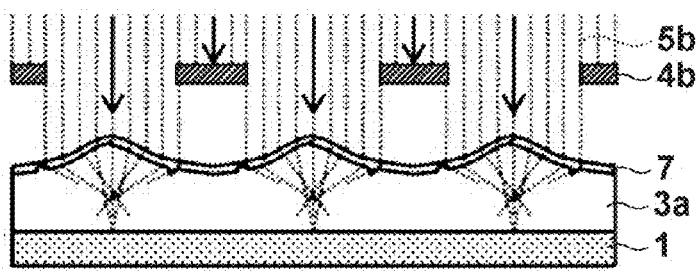
Figure 8C:
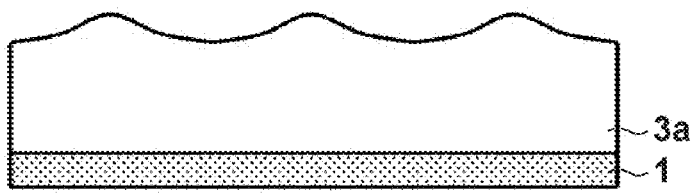
Figure 8D:
Figure 8E:
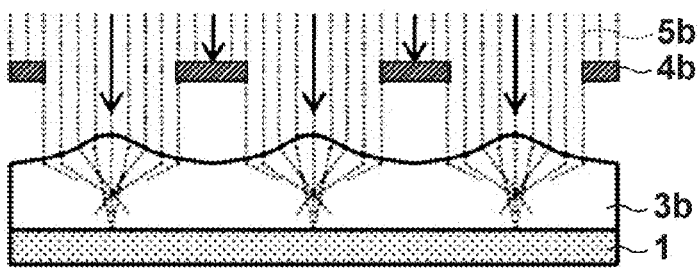

Also, the uneven photoresist film 3a formed after the first step may have a rough surface, so a process for smoothing this surface may be performed after the first development process. (1) As an example, after the first development process (FIG. 8A), a thin film 7 made of the same material as the uneven photoresist film 3a, or a thin film having a refractive index nearly equal to that of the photoresist film 3a can be deposited or applied on the photoresist film 3a (FIG. 8B). Hence, in the second exposure process to be performed later, the exposure light 5b can be more effectively refracted and condensed by the convex portions of a thin film 7a (FIG. 8B). (2) As another example, after the first development process, a heat treatment can be performed on the photoresist film 3a at a temperature lower than a pre-bake temperature. The same effect can be obtained with this operation. (3) As still another example, after the first development process (FIG. 8C), an isotropic etching process may be performed on the photoresist film 3a so that the photoresist film 3a defining the concave portions remains (FIG. 8D). The same effect can be obtained with this operation, and portions near the surface of the photoresist film 3a, in which the photosensitive material is inactivated in the first step, can be removed so that the uneven photoresist pattern 3b can be more effectively exposed to light in the subsequent second exposure process (FIG. 8E). These processes can also be performed as needed in other embodiments (to be described later).

Figure 5A:
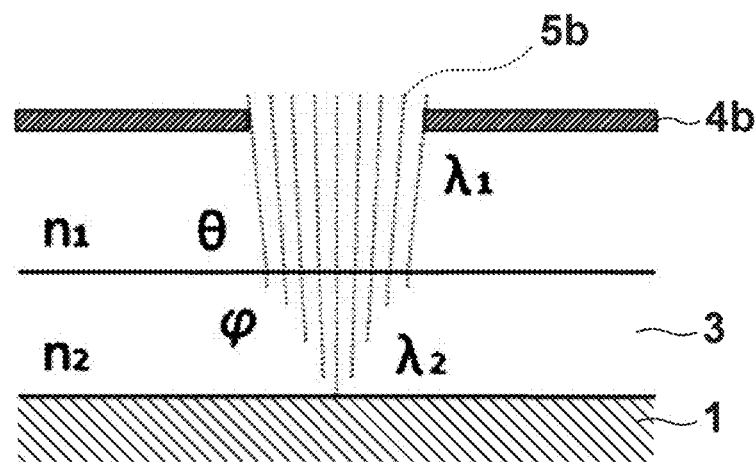
FIGS. 5A and 5B are views for explaining the effects of the conventional method and the first embodiment of the present invention, respectively.
Figure 5B:
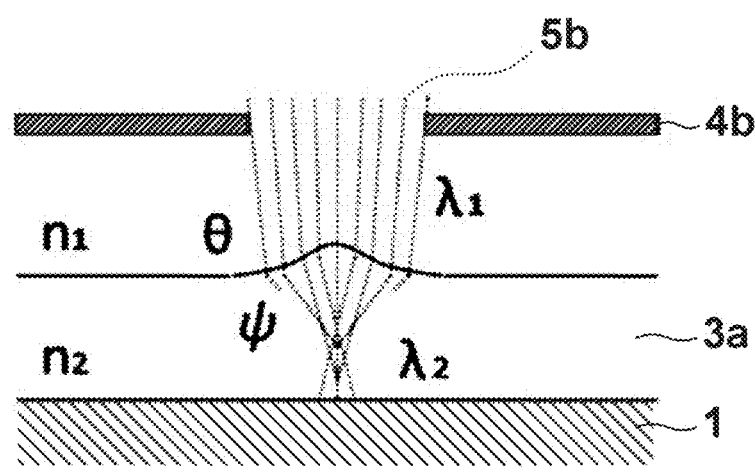

FIGS. 5A and 5B show how exposure light having passed through a mask is condensed by the projection lens (not shown) and exposes the photoresist film, in which FIG. 5A shows the case of the conventional method; and FIG. 5B shows the case of this embodiment. Let n1 be the refractive index of the medium between the lens and the wafer, n2 be the refractive index of the photoresist material, e be the beam divergence of the exposure light between the lens and the wafer, φ be the angle of refraction of the exposure light in the conventional method, and ψ be the angle of refraction of the exposure light in this embodiment. According to this embodiment, the exposure light is condensed by the convex portions of the photoresist film, so ψ>φ. Accordingly, from equations (1) and (2), the resolution line width R can be reduced by a factor of R2/R1=sin φ/sin φ, where R1 is the resolution line width of the lithography technique in the conventional method, and R2 is the resolution line width of the lithography technique in this embodiment.

Second Embodiment

A pattern forming method according to the second embodiment of the present invention will be described next. The difference between the first and second embodiments lies in that in the latter a gray-tone mask, as shown in FIGS. 9A to 9C, is used as a first mask in a first exposure process of a first step. In this case, the first mask includes light-shielding portions 21, a light transmissive portion 22, and slit pattern portions 23a each having a feature size equal to or smaller than the resolution limit. The first mask has at least one pattern of groups formed by, for example, a line-and-space pattern (FIG. 9A), a hole pattern (FIG. 9B), and a wiring pattern (FIG. 9C). In this case, even when a photoresist material having steep γ characteristics, as shown in FIG. 4A, is used, an uneven photoresist film 3a having a thickness which is smaller in concave portions than in convex portions can easily be formed in a first step.

Figure 10A:
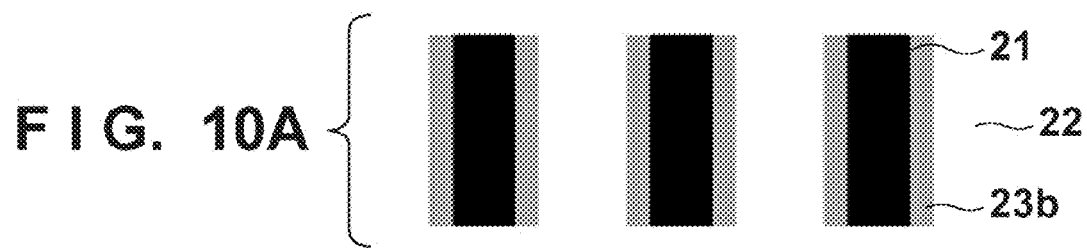
FIGS. 10A to 10C are views for explaining another mask used in the second embodiment of the present invention.
Figure 10B:
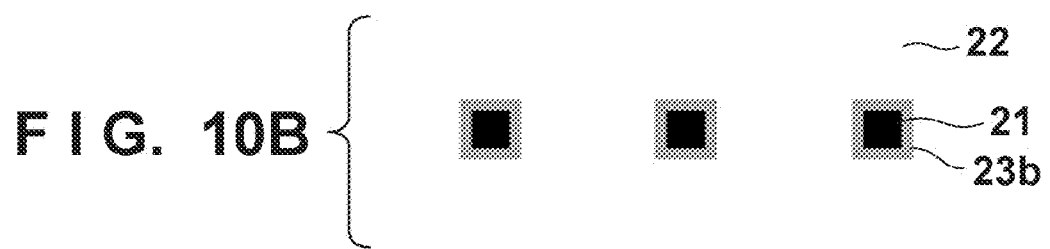
Figure 10C:
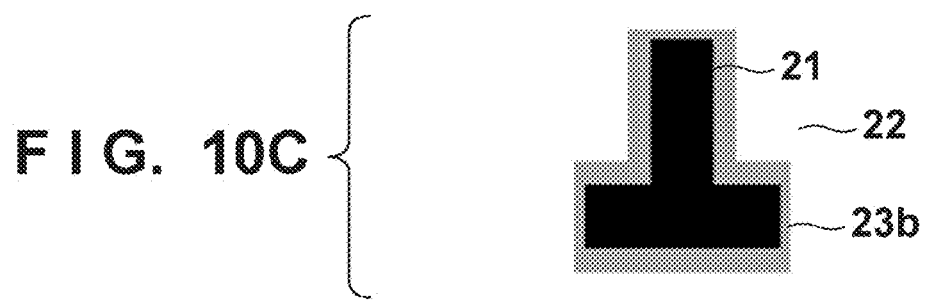

A halftone mask, as shown in FIGS. 10A to 10C, can also be used as the first mask. In this case, the first mask includes light-shielding portions 21, a light transmissive portion 22, and semi-light transmissive portions 23b. The first mask has at least one pattern of groups formed by, for example, a line-and-space pattern (FIG. 10A), a hole pattern (FIG. 10B), and a wiring pattern (FIG. 10C). As described above, the first step can easily be performed using a mask having an adjusted transmitted light amount distribution as well.

A first development process is then performed in the same way as in the first embodiment, and the uneven photoresist film 3a formed in the first step is processed in a second step to form a photoresist pattern 3b including, in portions which have been the convex portions, openings each having a width narrower than that of the convex portion. Upon this operation, super-resolution minute openings can be formed, thus forming a super-resolution fine pattern in an arbitrary portion.

Third Embodiment

Figure 11A:
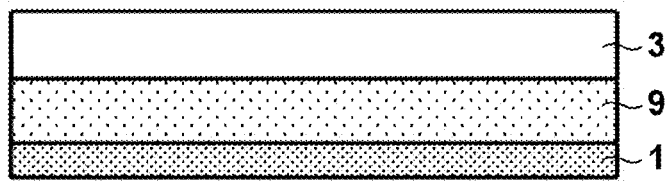
FIGS. 11A to 11D are pattern sectional views for explaining a patterning method according to the third embodiment of the present invention.
Figure 11B:
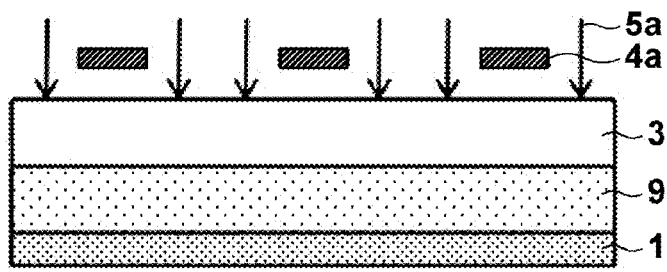
Figure 11C:
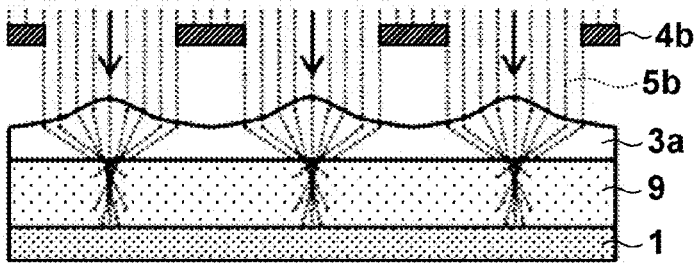
Figure 11D:
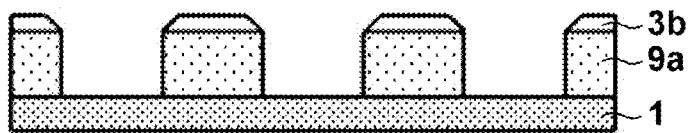

A pattern forming method according to the third embodiment of the present invention will be described next with reference to FIGS. 11A to 11D. FIGS. 11A to 11D are pattern sectional views in in steps according to the third embodiment. The difference between the first and third embodiments lies in that in the latter a first step is performed upon stacking a photoresist material having steep γ characteristics, as shown in FIG. 4, on an underlayer, and stacking a photoresist material having slow γ characteristics on the former photoresist material. First, a photoresist material 9 having steep γ characteristics is applied onto an underlayer 1, and a photoresist material 3 having slow γ characteristics is applied onto the photoresist material 9 to obtain a state shown in FIG. 11A. A first exposure process is then performed, as shown in FIG. 11B, in the same way as in the first embodiment, and a first development process is performed to obtain a state shown in FIG. 11C. Upon this operation, an uneven photoresist film 3a having a thickness which is smaller in concave portions than in convex portions can be formed on the photoresist material 9 having steep γ characteristics. Further, a state shown in FIG. 11D is obtained upon a second step in the same way as in the first embodiment.

This embodiment is effective in that a photoresist material having slow γ characteristics and convex portions for refracting and condensing exposure light, and a photoresist material which has steep γ characteristics and serves to form a high-resolution pattern can be used separately.

Fourth Embodiment

Figure 12A:
FIGS. 12A to 12D are views for explaining a patterning method according to the fourth embodiment of the present invention.
Figure 12B:
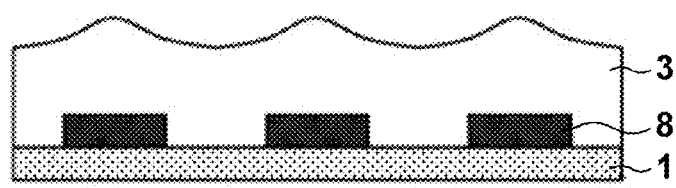

A pattern forming method according to the fourth embodiment of the present invention will be described next with reference to FIGS. 12A to 12D. FIGS. 12A to 12D are pattern sectional views in steps according to the fourth embodiment. The difference between the first and fourth embodiments lies in that in the latter in a first step, first, a pattern 8 is formed on an underlayer 1, and a photoresist material 3 is applied onto the underlayer 1 and pattern 8 so as to cover them. More specifically, a pattern 8 made of, for example, a metal is formed on an underlayer 1 in regions in which convex portions are to be formed, as shown in FIG. 12A. A photoresist material 3 is then applied onto the underlayer 1 and pattern 8 so as to cover them, as shown in FIG. 12B. This method can form convex and concave portions corresponding to the uneven photoresist film 3a in the first embodiment without neither a first exposure process nor a first development process, unlike the first embodiment.

Figure 12C:
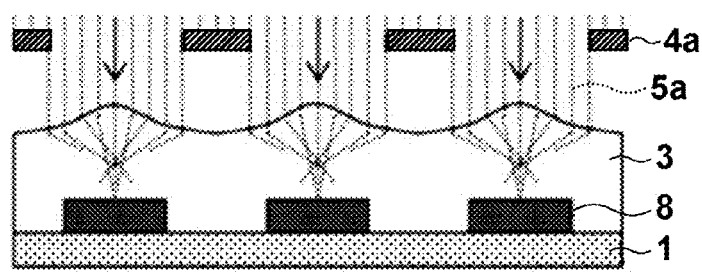
Figure 12D:
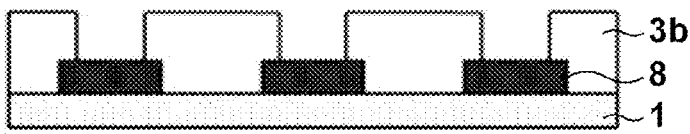

A second step is then performed, as shown in FIG. 12C, in the same way as in the first embodiment to obtain a state shown in FIG. 12D. In this state, a photoresist pattern 3b including, in portions which have been the convex portions, openings each having a width narrower than that of the convex portion is formed. This embodiment is effective in forming, for example, a super-resolution hole pattern with a very narrow width on a metal wiring line.

Fifth Embodiment

A pattern forming method according to the fifth embodiment of the present invention will be described next. The difference between the first and fifth embodiments lies in that in the latter after first and second steps are performed, steps similar to the first and second steps are repeatedly performed again using two masks. The case wherein a line-and-space pattern is formed will be described below with reference to FIGS. 13A to 13E. FIGS. 13A to 13E are pattern sectional views in steps according to the fifth embodiment. First, an underlayer 2 is deposited on an underlayer 1. The underlayer 1 is, for example, a silicon substrate, and an object for forming a desired pattern later, such as an SiN film or a metal film, can be selected as the underlayer 2.

Figure 13A:
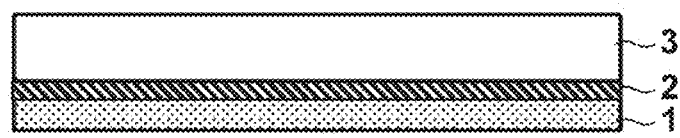
FIGS. 13A to 13J are pattern sectional views for explaining a patterning method according to the fifth embodiment of the present invention.
Figure 13B:
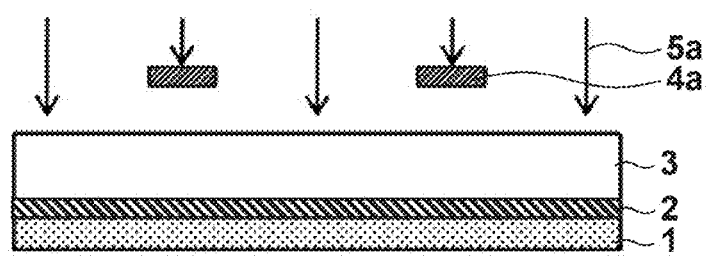

In the first step, in accordance with the same procedure as in the first embodiment, a photoresist material 3 having slow γ characteristics, as shown in FIG. 4, is applied onto the underlayer 2 to obtain a state shown in FIG. 13A. A first exposure process of irradiating the photoresist material 3 with exposure light 5a is performed using a first mask including light-shielding portions 4a, for example, a first mask having a line-and-space pattern as shown in FIG. 3A (FIG. 13B). A first development process is then performed to form an uneven photoresist film 3a (FIG. 13C).

Figure 13C:
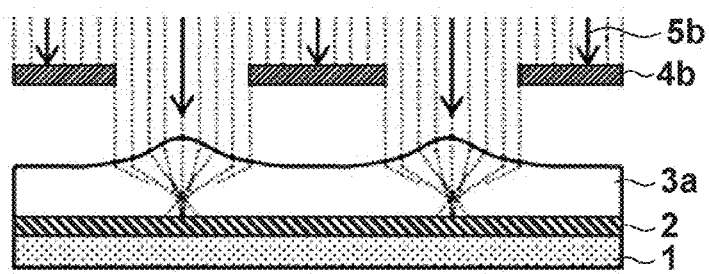
Figure 13D:
Figure 13E:

In a second step, a second exposure process of irradiating the photoresist film 3a with exposure light 5b is performed using a first mask including light-shielding portions 4b, for example, a first mask having a line-and-space pattern as shown in FIG. 6A (FIG. 13C). A second development process is then performed to obtain a state shown in FIG. 13D. Upon this operation, a photoresist pattern 3b including, in portions which have been the convex portions, openings each having a width narrower than that of the convex portion is formed. The underlayer 2 is then etched by, for example, isotropic etching to obtain a state shown in FIG. 13E. In this state, a super-resolution fine line-and-space pattern 2a can be formed.

Figure 13F:
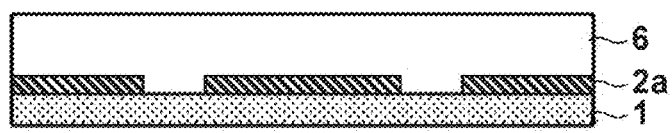
Figure 13G:
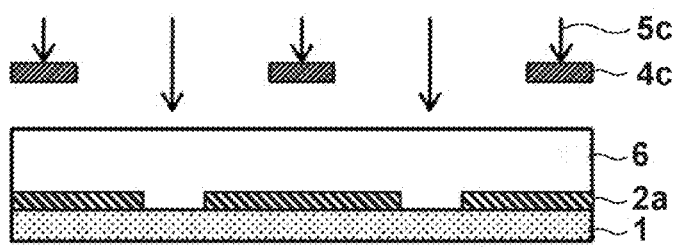

Further, in a third step, a photoresist material 6 is applied onto the underlayer 1 and pattern 2a again to obtain a state shown in FIG. 13F. A third exposure process of irradiating the photoresist material 6 with exposure light 5c is performed using a third mask under almost the same conditions as in the first exposure process (FIG. 13G). At this time, a line-and-space pattern (FIG. 14A) shifted by a half pitch with respect to the first mask can be used as the third mask. A third development process is then performed to obtain a state shown in FIG. 13H. Upon this operation, an uneven photoresist film 6a is formed. At this time, the uneven photoresist film is shifted by a half pitch with respect to the unevenness formed in the first step. More specifically, the photoresist film 3a includes at least two convex shapes, and the photoresist film 6a includes convex shapes at the centers of the positions at which the two convex shapes of the photoresist film 3a have been present.

Figure 13H:
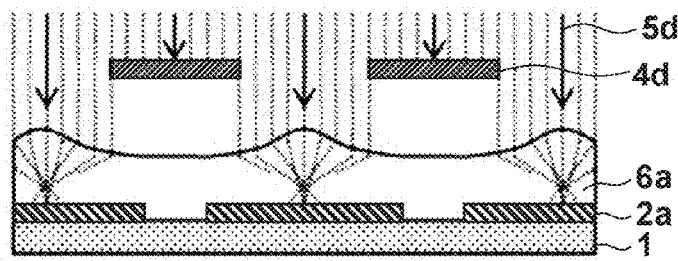
Figure 13I:
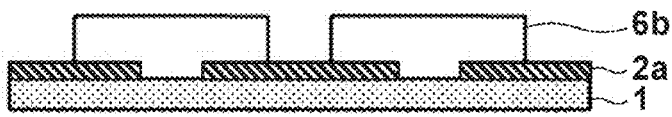
Figure 13J:
Figure 14A:
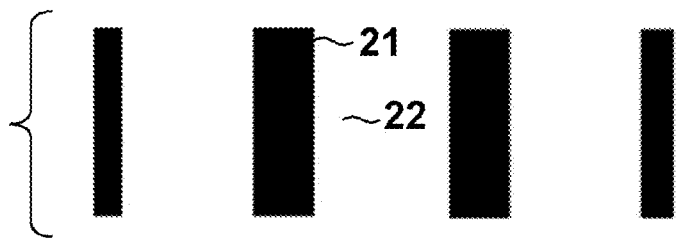
FIGS. 14A to 14D are views for explaining a mask used in the fifth embodiment of the present invention.
Figure 14B:
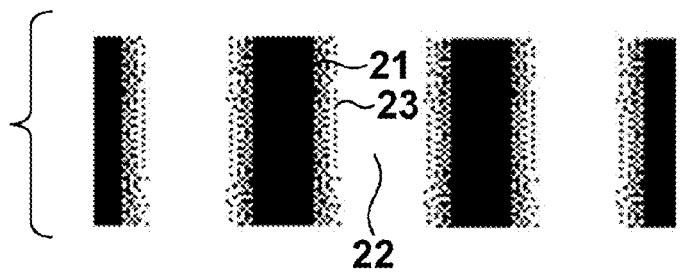
Figure 14C:
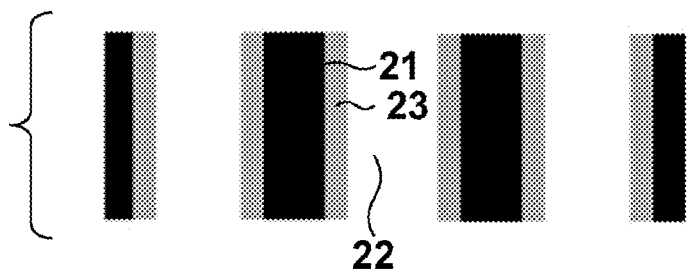
Figure 14D:
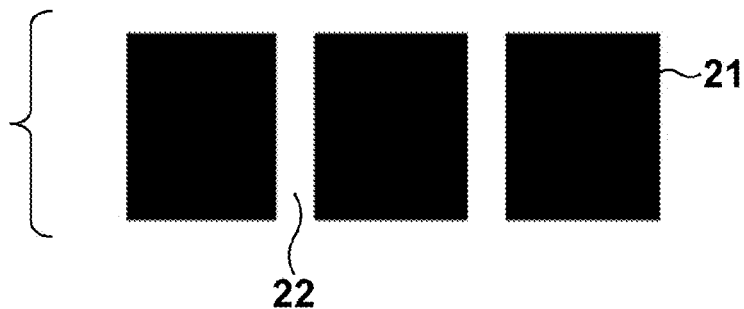

In a fourth step, a fourth exposure process of irradiating the photoresist film 6a with exposure light 5d is performed using a fourth mask (FIG. 13H). At this time, the fourth mask has a line-and-space pattern which is shifted by a half pitch with respect to the second mask and can serve to at least partially expose the convex portions of the photoresist film formed in the third step (FIG. 14D). Hence, in the fourth exposure process, the exposure light 5d is refracted and condensed by the convex portions of the photoresist film 6a, so exposed portions in the convex portions of the photoresist film 6a become regions narrower than the convex portions. After the fourth exposure process, a fourth development process is performed to remove exposed photoresist portions. In this way, in the fourth step, the uneven photoresist film formed in the third step is processed to form a photoresist pattern 6b including, in portions which have been the convex portions, openings each having a width narrower than that of the convex portion to obtain a state shown in FIG. 13I. The pattern 2a is then etched by, for example, isotropic etching to obtain a state shown in FIG. 13J. In this state, a super-resolution fine line-and-space pattern 2b is formed.

This method can not only form a super-resolution fine pattern but also double the packing density of a super-resolution fine pattern. Also, although the above-mentioned step is repeated twice, it can also be repeated three or more times to increase the packing density of a super-resolution fine pattern by a factor of three or more.

Moreover, in this embodiment, a photoresist material having steep γ characteristics, as shown in FIG. 4, can be used, and a gray-tone mask (FIG. 14B) or a halftone mask (FIG. 14C) can be used as a third mask.

Sixth Embodiment

Figure 15A:
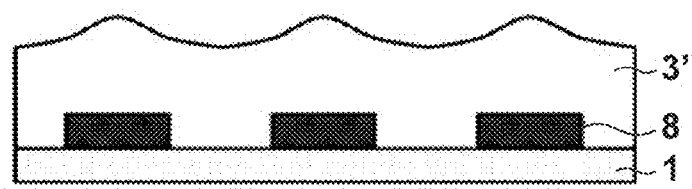
FIGS. 15A to 15C are pattern sectional views for explaining a patterning method according to the sixth embodiment of the present invention.
Figure 15B:
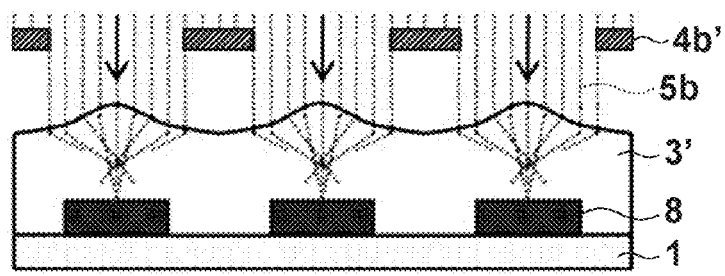
Figure 15C:
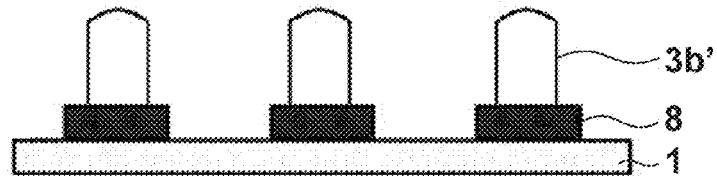

A pattern forming method according to the sixth embodiment of the present invention will be described next with reference to FIGS. 15A to 15C. FIGS. 15A to 15C are patterns sectional views in steps according to the sixth embodiment. The difference between the first and sixth embodiments lies in that in the latter a negative photoresist material is used.

As for a negative photoresist material, exposed portions of the coated photoresist material remain upon a subsequent development process. For this reason, in a first step, a method of forming a pattern 8 on an underlayer 1, and applying a negative photoresist material onto the underlayer 1 and pattern 8 so as to cover them and form an uneven photoresist layer 3' can be adopted, unlike the first embodiment. More specifically, a pattern 8 made of, for example, a metal is formed on an underlayer 1 in regions in which convex portions are to be formed. A photoresist material is applied onto the underlayer 1 and pattern 8 so as to cover them and form a photoresist layer 3' including convex portions on the pattern 8, as shown in FIG. 15A. This method can form an uneven photoresist layer 3' (FIG. 15B).

A second exposure process of irradiating the photoresist layer 3' with exposure light 5b is performed (FIG. 15B). At this time, the exposure light 5b is refracted and condensed by the convex portions of the photoresist layer 3', so exposed portions in the convex portions of the photoresist layer 3' become regions narrower than the convex portions. A second development process is then performed to obtain a state shown in FIG. 15C. Upon this operation, a photoresist portion 3b' having a width narrower than that of the convex portions can be formed in portions which have been the convex portions. This embodiment is effective in forming, for example, a super-resolution wiring pattern with a very narrow width.

Seventh Embodiment

An embodiment to which the present invention is applied to a microlens array forming method will be described lastly as the seventh embodiment of the present invention with reference to FIGS. 16A to 16D. Also, although the following embodiment is basically the same as in the first embodiment, it can be modified as needed.

Figure 17A:
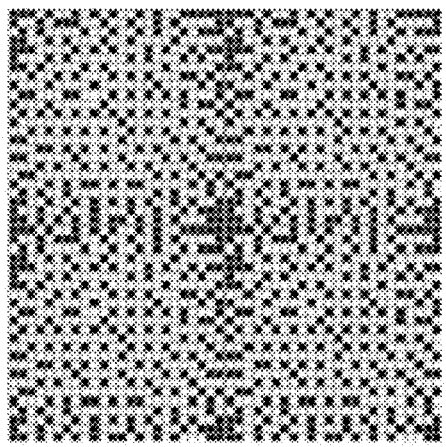
FIGS. 17A to 17E are views for explaining a mask used in the seventh embodiment of the present invention.
Figure 17D:
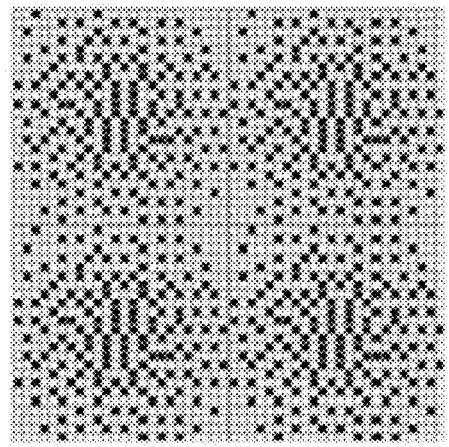
Figure 17B:
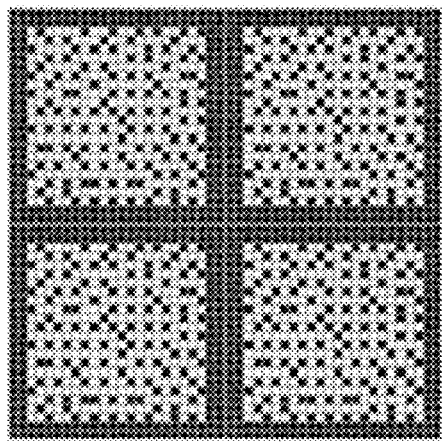
Figure 17E:
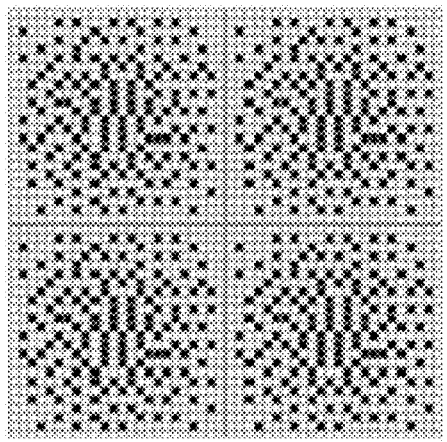
Figure 17C:
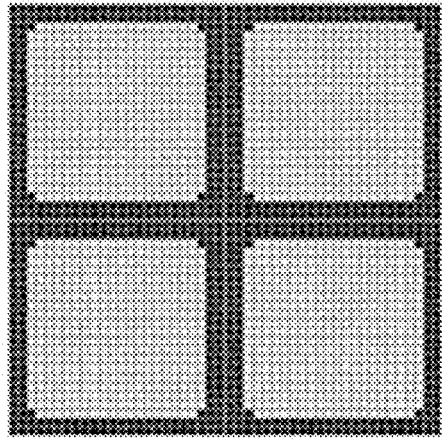

A first step will be described first. FIGS. 16A to 16D are sectional views in steps of forming microlenses 200 according to the seventh embodiment. An underlayer 100 for forming microlenses 200, for example, a substrate is prepared (FIG. 16A), and a photoresist material 110 for the microlenses 200 is applied onto the underlayer 100 in the same way as in the first embodiment to obtain a state shown in FIG. 16B. A first exposure process is then performed using a first mask. The first mask has, for example, a pattern with a light-shielding dot density which gradually increases from the center of each pixel to its outer periphery (FIG. 17A). Upon this operation, an uneven photoresist film 110a is formed upon a first development process to obtain a state shown in FIG. 16C. Note that a pattern, as shown in FIG. 17B or 17C, can also be used as the pattern of the first mask for the reason described in the first embodiment. At this time, as a process means for smoothing the surface of the photoresist film 110a, a heat treatment can also be performed on the photoresist film 110a at a temperature which does not inactivate the photosensitive material of the photoresist film 110a. This heat treatment can be done at, for example, 110° C. for 60 sec such that a second exposure process (to be described later) can be efficiently performed. Upon the above-mentioned first step, an uneven photoresist film 110a is formed on the underlayer 100.

A second step will be described below. A second exposure process of exposing the uneven photoresist film 110a formed in the first step is performed using a second mask. The second mask has, for example, a pattern with a light-shielding dot density which gradually decreases from the center of each pixel to its outer periphery (FIG. 17D or 17E). At this time, exposure light incident from a region having a relatively low light-shielding dot density is refracted and condensed by the convex portions of the photoresist material 110, so exposed portions in the convex portions of the photoresist film 110a become regions narrower than the convex portions. Upon this operation, the thickness of the photoresist film 110a becomes smaller in portions which have been the convex portions than in the concave portions upon a second development process, so a photoresist portion 110b is formed (FIG. 16D). Upon the above-mentioned second step, microlenses 200 are formed.

Also, this embodiment provides an example of the result of an experiment when a microlens 200 is actually formed using an i-line (λ=365 nm) exposure apparatus. The target shape in this experiment is defined as a spherical microlens 200 which has a height of 0.4 μm and is formed in a 1.0-μm$^2$ pixel at an occupied area ratio of 100%. Also, two-time exposure processes used in this experiment were performed with an alignment error of 10 nm. FIG. 18 shows an experimental result obtained by plotting the shape error with respect to the target shape on the ordinate as a function of the height of the convex portion on the uneven photoresist film 110a formed in the first step on the abscissa. As can be seen from FIG. 18, the shape error reduces as the height of the convex portion increases. As can also be understood from FIG. 18, in this experiment, the shape error with respect to the target error becomes 4% or less when the height of the convex portion is set to 50 nm or more. As described above, using the method according to the present invention, a microlens 200 having a height of 0.4 μm can be formed in a 1.0-μm$^2$ pixel by employing an i-line exposure apparatus.

Further, using the method according to the present invention, the pattern of the first mask can be changed as needed for each microlens 200, so the shape of each microlens 200 can be adjusted to adjust the condensing efficiency for each pixel.

As described above, according to this embodiment, a super-resolution fine pattern can be formed in an arbitrary portion to form a microlens shape having a high numerical aperture by the same method. Also, the patterning method and microlens forming method according to the present invention are not limited to the above-mentioned embodiments, and the respective embodiments can be combined and modified as needed, as a matter of course.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-191077, filed Sep. 1, 2011, which is hereby incorporated by reference herein in its entirety.

What is claimed is:

1. A photoresist pattern forming method comprising:
    a first step of forming on an underlayer a photoresist film which includes a convex portion and a concave portion having a thickness thinner than a thickness of the convex portion, wherein an upper surface of the photoresist film has a curved shape; and
    a second step of processing the photoresist film to form, in a portion which has been the convex portion, an opening having a width narrower than a width of the convex portion,
    wherein in the second step, the convex portion of the photoresist film is at least partially exposed, and the photoresist film is then developed, and
    exposure light is condensed by the convex portion in exposing the photoresist film.

2. The method according to claim 1, wherein
    the first step includes an exposure process and a development process,
    the exposure process is performed using a mask for exposing, of a region to serve as the convex portion and a region to serve as the concave portion, the region to serve as the concave portion, and
    the exposure process is performed in an exposure amount in which the photoresist film is formed in the development process.

3. The method according to claim 1, wherein
    the first step includes an exposure process and a development process, and
    the exposure process is performed using a mask having a transmitted light amount distribution adjusted to form a convex portion and a concave portion.

4. The method according to claim 1, wherein in the first step, a pattern is formed on the underlayer in a region in which the convex portion is to be formed, and a photoresist material is applied onto the underlayer and the pattern so as to cover the underlayer and the pattern, thereby forming the photoresist film including the convex portion on the pattern.

5. The method according to claim 1, wherein the convex portion changes into a concave portion after the second step.

6. A photoresist pattern forming method comprising:
    a first step of forming on an underlayer a photoresist film which includes a convex portion and a concave portion having a thickness thinner than a thickness of the convex portion, wherein an upper surface of the photoresist film has a curved shape; and
    a second step of processing the photoresist film to form, in a portion which has been the convex portion, a photoresist portion having a width narrower than a width of the convex portion,
    wherein in the first step, a pattern is formed on the underlayer in a region in which the convex portion is to be formed, and a photoresist material is applied onto the underlayer and the pattern so as to cover the underlayer and the pattern, thereby forming the photoresist film including the convex portion on the pattern, and
    in the second step, the convex portion on the photoresist film is at least partially exposed, and the photoresist film is then developed, and
    exposure light is condensed by the convex portion in exposing the photoresist film.

7. The method according to claim 6, wherein the convex portion changes into a concave portion after the second step.

8. A microlens array forming method comprising:
    a first step of forming on an underlayer a photoresist film which includes a convex portion and a concave portion having a thickness thinner than a thickness of the convex portion; and
    a second step of processing the photoresist film so that a thickness of the photoresist film becomes smaller in a portion which has been the convex portion than in the concave portion,
    wherein the second step includes an exposure process and a development process which use a mask for exposing the convex portion, of the convex portion and the concave portion, and
    wherein exposure light is condensed by the convex portion in the exposure process.

9. The method according to claim 8, wherein the convex portion changes into a concave portion after the second step.

10. The method according to claim 8, wherein an upper surface of the photoresist film including the convex portion and the concave portion has a curved shape.

11. The method according to claim 8, wherein the convex portion and the concave portion are configured to form a lens.

12. A photoresist pattern forming method comprising:
a first step of forming, on an underlayer, a photoresist film which includes a convex portion and a concave portion having a thickness thinner than a thickness of the convex portion, wherein the convex portion and the concave portion are configured to form a lens; and
a second step of processing the photoresist film to form, in a portion which has been the convex portion, an opening having a width narrower than a width of the convex portion,
wherein in the second step, the convex portion of the photoresist film is at least partially exposed, and the photoresist film is then developed, and
exposure light is condensed by the convex portion in exposing the photoresist film.

13. A photoresist pattern forming method comprising:
a first step of forming, on an underlayer, a photoresist film which includes a convex portion and a concave portion having a thickness thinner than a thickness of the convex portion, wherein the convex portion and the concave portion are configured to form a lens; and
a second step of processing the photoresist film to form, in a portion which has been the convex portion, a photoresist portion having a width narrower than a width of the convex portion,
wherein in the first step, a pattern is formed on the underlayer in a region in which the convex portion is to be formed, and a photoresist material is applied onto the underlayer and the pattern so as to cover the underlayer and the pattern, thereby forming the photoresist film including the convex portion on the pattern, and
in the second step, the convex portion on the photoresist film is at least partially exposed, and the photoresist film is then developed, and
exposure light is condensed by the convex portion in exposing the photoresist film.

* * * * *